(12) United States Patent
Long

(10) Patent No.: US 11,246,217 B2
(45) Date of Patent: Feb. 8, 2022

(54) ELECTRONICS CONNECTORS HAVING POWER-REGULATING PASSIVE COMPONENTS

(71) Applicant: Intel Corporation, Santa Clara, CA (US)

(72) Inventor: Brian J. Long, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 16/330,043

(22) PCT Filed: Oct. 1, 2016

(86) PCT No.: PCT/US2016/055072
§ 371 (c)(1),
(2) Date: Mar. 1, 2019

(87) PCT Pub. No.: WO2018/063412
PCT Pub. Date: Apr. 5, 2018

(65) Prior Publication Data
US 2019/0215960 A1 Jul. 11, 2019

(51) Int. Cl.
*H05K 1/14* (2006.01)
*H01R 12/73* (2011.01)
(Continued)

(52) U.S. Cl.
CPC ........... *H05K 1/141* (2013.01); *H01R 12/716* (2013.01); *H01R 12/721* (2013.01); *H01R 12/73* (2013.01);
(Continued)

(58) Field of Classification Search
CPC .... H01R 12/721; H01R 12/716; H01R 12/73; H01R 13/631; H01R 13/6658;
(Continued)

(56) References Cited

U.S. PATENT DOCUMENTS

| | | | | |
|---|---|---|---|---|
| 6,019,616 A | * | 2/2000 | Yagi | H01R 13/6582 439/108 |
| 6,542,373 B1 | * | 4/2003 | Oba | H05K 1/117 174/261 |

(Continued)

OTHER PUBLICATIONS

International Search Report dated Aug. 11, 2017, in International Application No. PCT/US2016/055072, filed Oct. 1, 2016, 6 pages.

*Primary Examiner* — Edwin A. Leon
*Assistant Examiner* — Matthew T Dzierzynski
(74) *Attorney, Agent, or Firm* — Schwabe, Williamson & Wyatt, P.C,

(57) ABSTRACT

Electronic device package technology is disclosed. In one example, a connector for coupling an electronics sub-assembly to an electronics assembly includes a connector body. The connector body has a sub-assembly interface and a circuit board interface. The connector body has at least one passive electronic component that is necessary for operating the sub-assembly, thereby maximizing available space for computational components on the sub-assembly. The connector body can comprise two separate bodies wherein the passives are contained between the bodies. At least one extension cable can electrically couple the connector to the sub-assembly. A method of making an electronics assembly, capable of receiving a sub-assembly via a connector, comprises providing an assembly circuit board having an electrically coupled connector with at least one passive electronic component.

28 Claims, 6 Drawing Sheets

(51) Int. Cl.
   *H01R 12/71* (2011.01)
   *H01R 12/72* (2011.01)
   *H01R 13/66* (2006.01)

(52) U.S. Cl.
   CPC .................... *H01R 13/6658* (2013.01); *H05K 2201/10159* (2013.01); *H05K 2201/10189* (2013.01)

(58) Field of Classification Search
   CPC ...... H01R 12/52; H01R 12/57; H01R 12/724; H01R 12/737; H01R 12/83; H01R 13/6625; H05K 1/117; H05K 2201/10159; H05K 1/144; H05K 1/141
   See application file for complete search history.

(56) References Cited

U.S. PATENT DOCUMENTS

| | | | |
|---|---|---|---|
| 6,544,061 B1* | 4/2003 | Yasufuku | H01R 13/631 439/310 |
| 7,045,891 B2* | 5/2006 | Choi | H05K 1/142 257/723 |
| 7,172,432 B2* | 2/2007 | Campini | H05K 1/144 361/736 |
| 7,513,779 B2* | 4/2009 | Barr | H01R 13/6625 439/607.01 |
| 7,540,743 B2* | 6/2009 | Park | H01R 13/631 439/65 |
| 8,092,233 B1* | 1/2012 | Lee | H01R 12/716 439/74 |
| 9,408,328 B2* | 8/2016 | Nigen | H05K 7/20436 |
| 9,504,160 B2* | 11/2016 | Oh | H01R 12/7082 |
| 9,640,885 B2* | 5/2017 | Amini | H01R 13/6583 |
| 10,243,304 B2* | 3/2019 | Kirk | H01R 13/6599 |
| 2004/0248432 A1 | 12/2004 | Barr | |
| 2011/0211310 A1* | 9/2011 | Fading | G06F 1/185 361/679.31 |
| 2013/0329352 A1 | 12/2013 | Nigen et al. | |
| 2015/0138735 A1 | 5/2015 | Oh et al. | |

\* cited by examiner

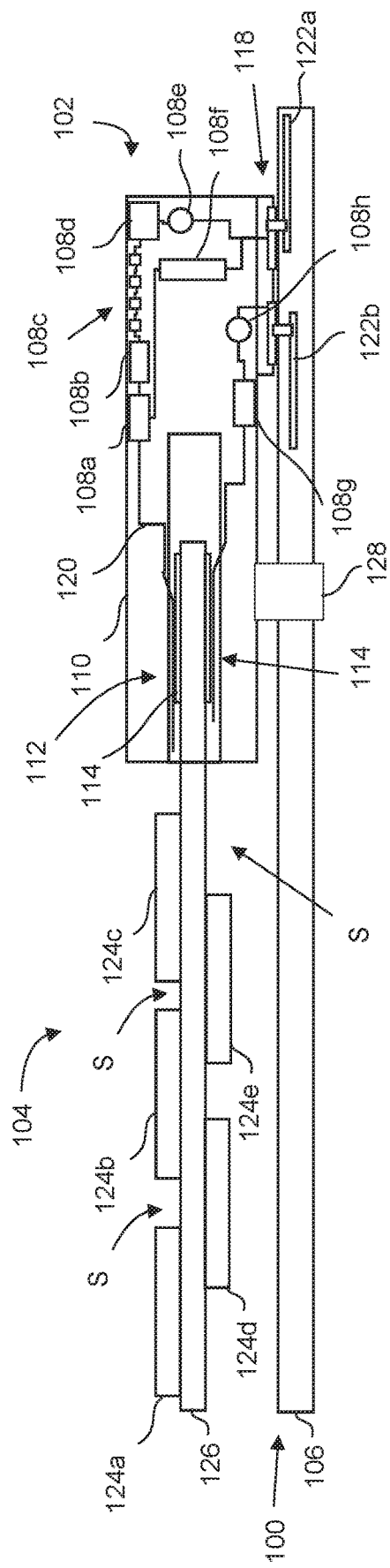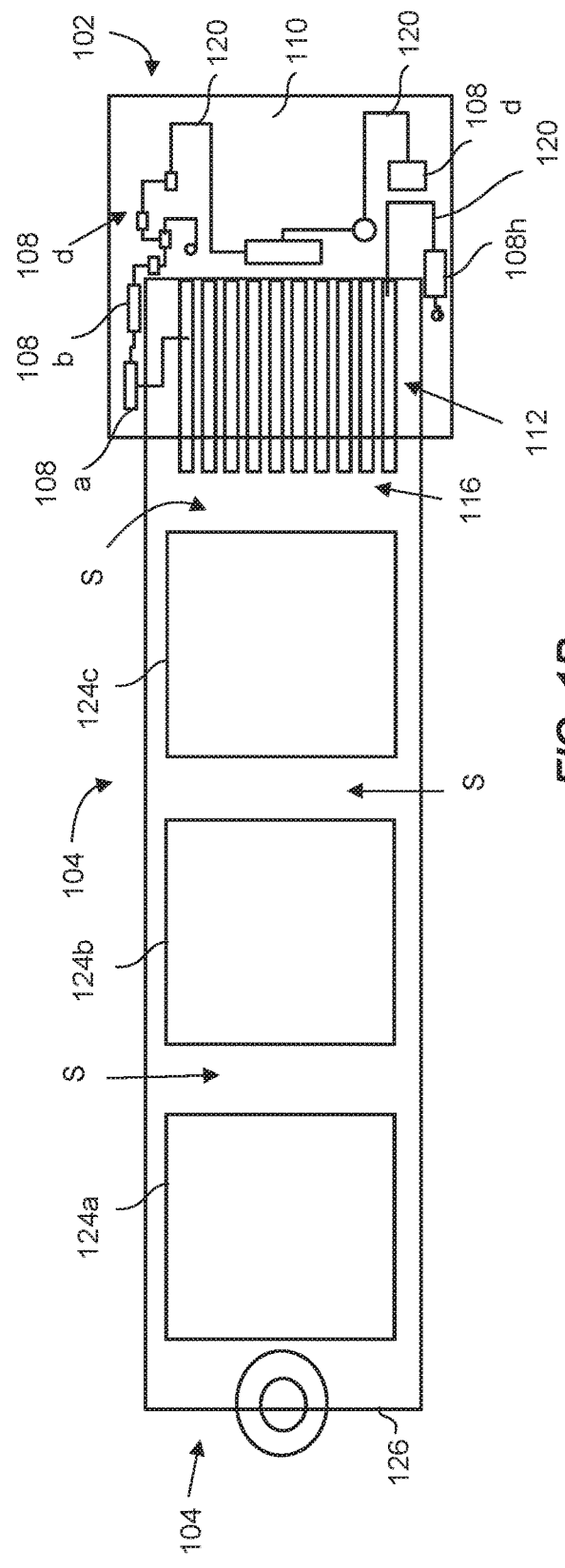

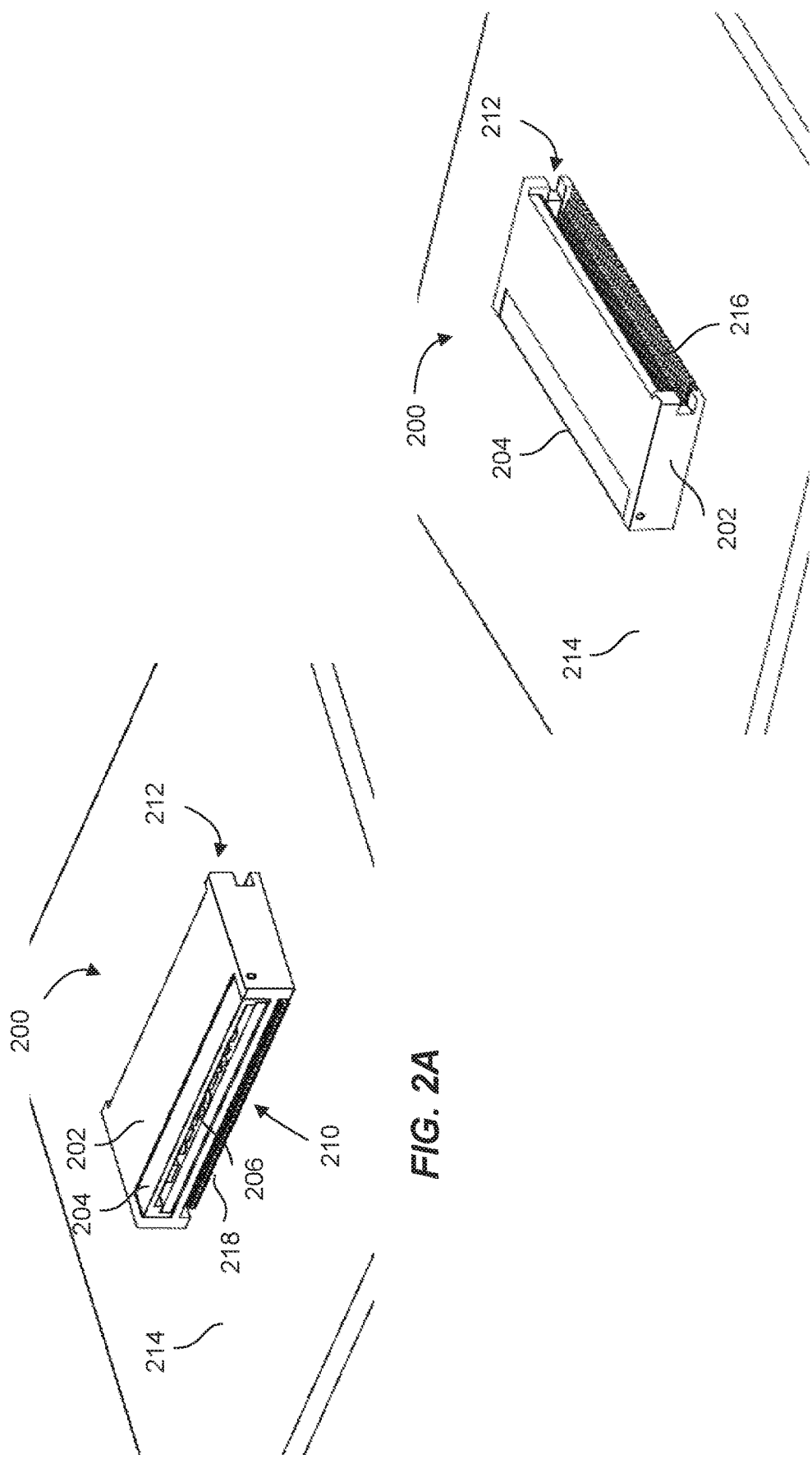

ELECTRONICS CONNECTORS HAVING POWER-REGULATING PASSIVE COMPONENTS

CROSS-REFERENCE TO RELATED APPLICATIONS

This patent application is a U.S. National Phase Application under 35 U.S.C. § 371 of International Application No. PCT/US2016/055072, filed on Oct. 1, 2016, the entire contents of which is hereby incorporated by reference herein.

TECHNICAL FIELD

Embodiments described herein relate generally to connector devices for connecting an electronics assembly to an electronics sub-assembly.

BACKGROUND

There is an ever-growing demand to shrink the size of electronic devices, most especially portable electronic devices, such as smart phones, tablets, and notebook computers. This demand pressurizes a reduction in size of electronics assemblies and sub-assemblies used in such devices.

Many electronics assemblies (e.g., a motherboard or other main system PCB) are capable of receiving one or more electronics sub-assemblies to enhance their function and operation. One example is a memory sub-assembly (e.g., an M.2 solid-state memory device) that can be added to an electronics assembly and expand its memory capacity. The modular addition of electronics sub-assemblies to an electronics assembly typically requires a connector having wires that provide an electrically conductive pathway between the electronics assembly and sub-assembly. The utility of such connectors has typically been limited to the creation of an electrical connection.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein:

FIG. 1A schematically shows a side view of an electronics assembly coupled to a sub-assembly by a connector in accordance with one example;

FIG. 1B schematically shows a top view of a portion FIG. 1A;

FIG. 2A shows an isometric rear view of a connector in accordance with one example;

FIG. 2B shows an isometric front view of the connector of FIG. 2A;

Figure 3:
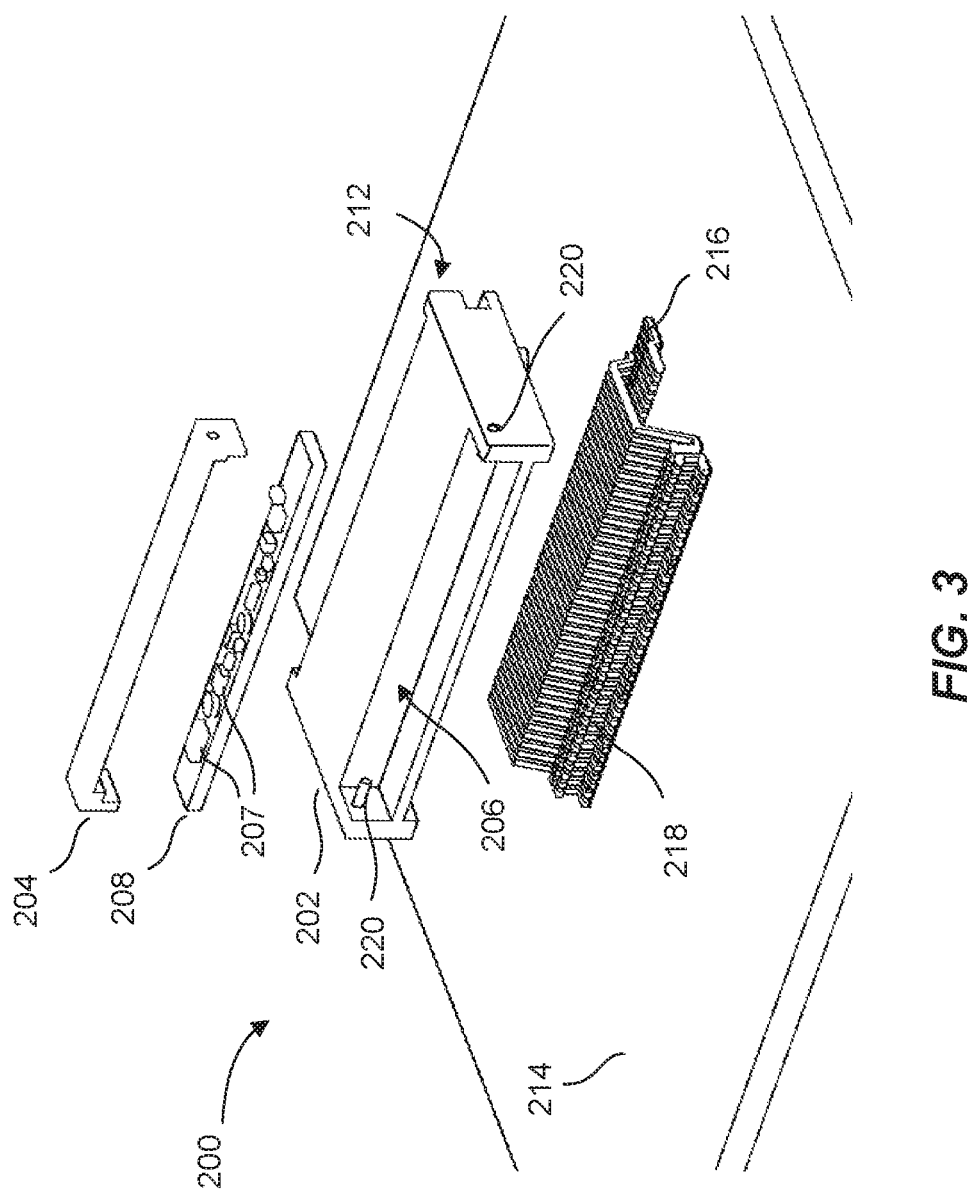
FIG. 3 shows an exploded isometric view of the connector of FIGS. 2A and 2B.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes support for a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example," means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Despite wide use of connectors for electrically coupling electronics sub-assemblies to an electronics assembly, little else has been demanded of such connector devices. In view of the increasing size reduction demands on both electronics assemblies and sub-assemblies, moving certain components off of the assemblies/sub-assemblies and into a connector can provide a significant overall space savings.

Accordingly, in one embodiment, a connector for coupling an electronics sub-assembly to an electronics assembly is provided. Such a connector can include a connector body having: a sub-assembly interface configured to electronically couple to an electronics sub-assembly; a circuit board interface configured to electronically couple to a circuit board of an electronics assembly; and at least one passive electronic component, such as a resistor, an inductor, or a capacitor. The at least one passive electronic component can be molded into the connector body. The at least one passive electronic component can be positioned in a cavity between two connector body sections. At least one extension cable can electrically couple the connector to the sub-assembly. An electronics assembly can comprise a circuit board electrically coupled to the connector, and a sub-assembly electrically coupled to the connector (either directly coupled, or indirectly coupled by at least one extension cable).

Methods of making an electronics assembly capable of receiving an electronics sub-assembly are also provided. In one embodiment, such a method can comprise providing an assembly circuit board electrically coupleable to a computer system; providing a connector having at least one passive electronic component and having a sub-assembly interface coupleable to a sub-assembly; and electrically coupling the connector to the assembly circuit board, wherein the at least one passive electronic component of the connector is electrically coupled to the circuit board.

FIG. 1A shows a schematic side view of an electronics assembly 100 having a connector 102 coupled to an electronics sub-assembly 104 in accordance with an example. FIG. 1B shows a schematic top view of only the connector 102 and the sub-assembly 104 of FIG. 1A. The electronics assembly 100 can include a substrate 106, such as used in a system printed circuit board (PCB). The connector 102 is physically attached (e.g., soldered-down) to the substrate 106, and the sub-assembly 104 (e.g., an M.2 module) is removably and electrically coupled to the connector 102. The connector 102 includes at least one passive electronic component 108a-h necessary to operate the sub-assembly 104. Generally, connectors are typically comprised of dielectric material, such as a plastic or a polymer, so the present disclosure further allows for power passives to be insulated in the connector 102. Accordingly, as shown on FIGS. 1A and 1B, the sub-assembly is devoid of any passive devices because, in this example, they are contained within (e.g., molded in) the connector 102. This is an important and advantageous configuration because it maximizes available space S on the sub-assembly 104 to allow more space for other devices, such as memory chips or other computational devices on the sub-assembly 104 and/or the electronics assembly 100. Said another way, the sub-assembly 102 can be made smaller while having the same number and size/type of computational devices as compared to an existing sub-assembly having the same number and size/type of computational devices as the sub-assembly 104. For example, a standard M.2 sub-assembly (having passives on the M.2 sub-assembly) is 22 mm wide by 110 mm long. By moving the passives off of the M.2 sub-assembly (as disclosed herein), the length can be less than 110 mm long, which minimizes the size of the sub-assembly to fit into smaller packages. Additionally, removing the passives from the sub-assembly and/or the electronics assembly minimizes heat on the sub-assembly and/or the electronics assembly, which of course maximizes or increases operating speed of the electronic components of the assemblies as compared to existing sub-assemblies. Heat may also be minimized in this manner because the connector can be comprised of material that has higher thermal conductivity coefficient than the material of the substrates of the sub-assembly and/or the main electronics assembly.

More specifically and in one example, the connector 102 includes a connector body 110 having a sub-assembly interface 112 configured to electronically couple to the electronics sub-assembly 104. The sub-assembly interface 112 includes a plurality of electrical connectors (e.g. electrical contacts) 114 that electrically couple to a plurality of electrically connectors 116 of the sub-assembly 104. Such sub-assembly interface on a connector is standard and will not be shown or discussed in detail. The connector body 110 has a circuit board interface 118 configured to electronically couple to the substrate 106 of the electronics assembly 100. Such circuit board interface 118 is also standard and will not be shown or discussed further. Advantageously, the connector 102 includes a plurality of passive electronic components 108a-h contained therein. In one example, the passive electronic components 108a-h are co-injection molded into the connector body 110 (although these "passives" can be coupled to an external surface of the connector body 110 or contained therein through other means, such as described regarding FIGS. 2A-4B). FIGS. 1A and 1B show an example of the passives 108a-h electrically coupled, by wires 120, to respective other passives and/or electrical connectors of the interfaces 114 and/or 118. Said wires 120 may be flexible wires to account for the forces acting on the passives during the co-injection process.

An input rail 122a in the substrate 106 is electrically coupled to some of the passives (i.e., 108a-g), and an output rail 122b in the substrate 106 can be electrically coupled to other passive(s) (i.e., 108h). In some systems, voltage i/o rails may be 5V supplied from a main PCB to an M.2 device, for example. With the present disclosure, a 5V power supply can be split into other voltages by passives within the connector. For example, a 5V power supply from the electronics assembly 100 through rail 122a can be converted into separate power rails, such as 5V, 3V, 1.8V, etc., as dictated by the specific design and configuration of the passives in the connector 102, and as required by the power requirements of a particular sub-assembly, for example.

In some examples, the sub-assembly 104 is a small form factor device having a plurality of computational devices 124a-e (e.g., NAND, DRAM, ASIC, etc.) mounted to a sub-assembly substrate 126. The sub-assembly 104 can be physically coupled to the substrate 106 of the electronics assembly 100 by a dielectric support member 128 to properly position the sub-assembly 104 and its computational devices 124 away from the circuit board 106.

FIGS. 2A and 2B show an example of a connector 200 according to an example of the present disclosure, and FIG. 3 shows an exploded view of the connector 200. The connector 200 can include a primary body section 202 and a secondary body section 204 coupled to the primary body section 202 (e.g., by pins, adhesive, etc.). A cavity 206 (FIG. 3) is defined between the body sections 202 and 204 and contains passive electronic components 207. In this example, the passives 206 can be mounted to an elongated substrate 208, or they may be directly attached to a portion or surface of one or both body sections 202 and 204. The connector 200 can include a sub-assembly interface 210 (FIG. 2A) and an electronics assembly interface 212, both having similar features as described with reference to FIGS. 1A and 1B. The connector 200 may be electrically and physically attached (i.e., soldered-down) to a substrate 214 of an electronics assembly, and the sub-assembly interface 210 may receive a sub-assembly (as with FIG. 1A). As shown on FIG. 3, a plurality of main electrical connectors 216 may be internal to the connector 200 and may be electrically coupled to rails (not shown) in the substrate 214. Likewise, a plurality of sub-assembly electrical connectors 218 may be internal to the connector 200 and may be electrically attachable to a sub-assembly (not shown). Some of the electrical connectors 216 and 218 may be electrically coupled to the passives 207, similar to the description with reference to FIGS. 1A and 1B. FIG. 3 further shows a pair of pins 220 used to secure the secondary body section 204 (through holes) to the primary body section 202 to position and contain the passives 205 within the connector 200.

Figure 4A:
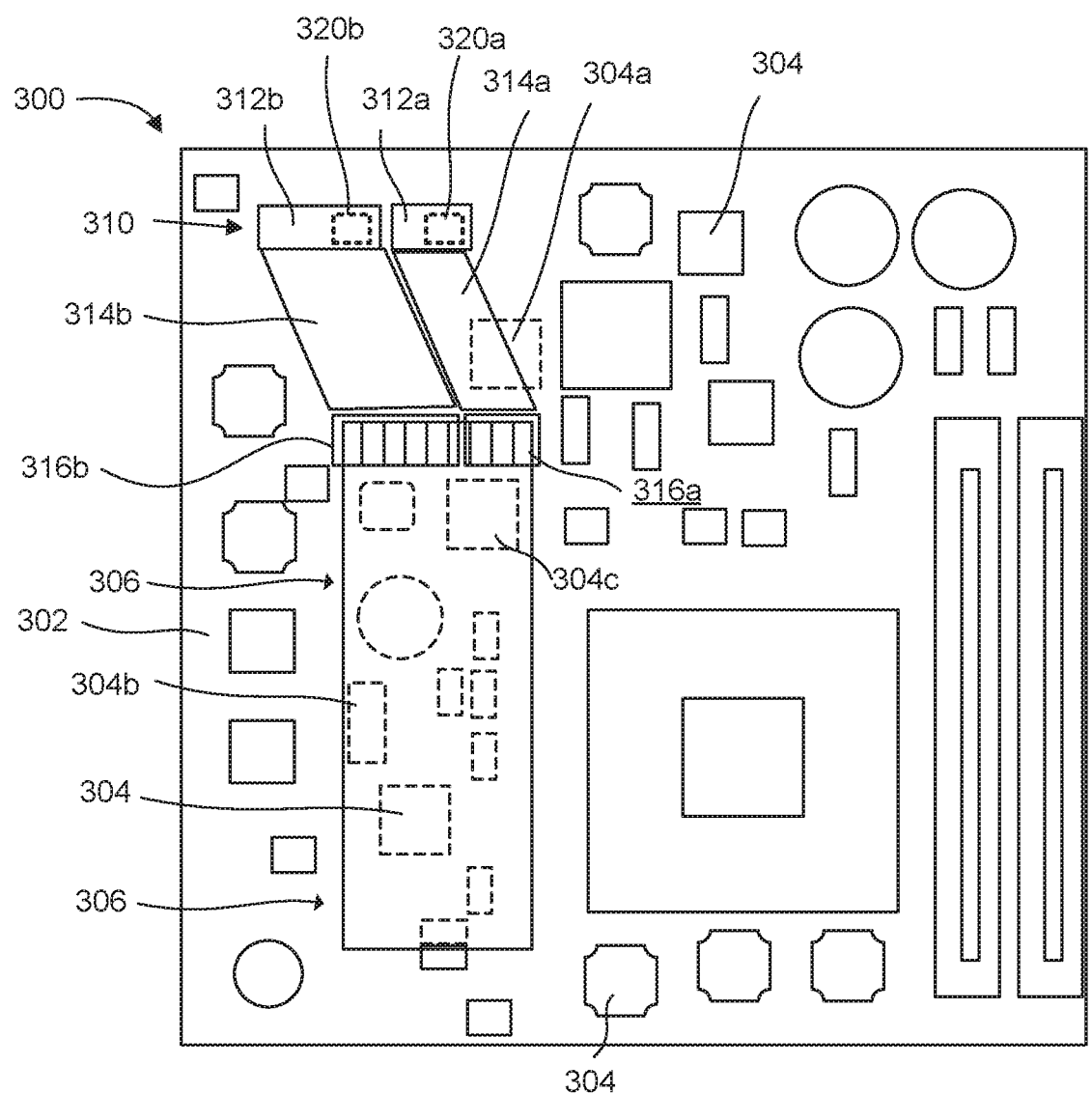
FIG. 4A schematically shows a top view of an electronics assembly in accordance with one example.
Figure 4B:
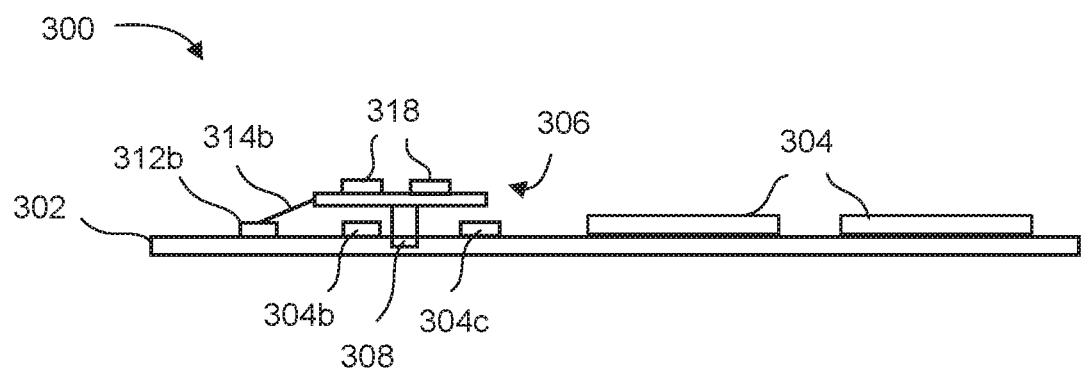
FIG. 4B is a front side view of a portion of FIG. 4A.

FIGS. 4A and 4B show an example of an electronics assembly 300 according to one example (note that FIG. 4B only shows a portion of a front and side view of FIG. 4A, for purposes of illustration clarity). This example illustrates an alternative configuration and method of maximizing space on a sub-assembly and/or on a circuit board of an electronics assembly by coupling the sub-assembly to a connector with at least one extension cable; this provides additional space in which to position electronic components on the circuit board. More specifically, and with reference to FIG. 4A, the electronics assembly 300 includes a circuit board 302 having a plurality of electronic components 304 attached thereto (e.g., chips soldered-down to the circuit board). A subassembly 306 can be mounted to the circuit board 302 by a dielectric mount device 308 (FIG. 4B) for structural support and to spatially position the sub-assembly above and away from the circuit board 302. Generally, the sub-assembly 306 can be electronically coupled to at least one connector by at least one extension cable. In the example of FIG. 4A, a connector 310 comprises a power body section 312a and an adjacent signal body section 312b, which both can be soldered-down to the circuit board 302 (the body section can be part of one connector or a pair of separate, adjacent connectors attached to the circuit board 302). A power extension cable 314a electrically couples the power body section 312a to the sub-assembly 306. Accordingly, the power extension cable 314a can be electrically coupled to electrical connectors 316a (e.g., fingers) on the sub-assembly 306. The power extension cable 314a can transmit power and provide ground between the circuit board 302 and the sub-assembly 306. Likewise, a signal extension cable 314b electrically couples the signal body section 312b to the sub-assembly 306. Accordingly, the signal extension cable 314b can be electrically coupled to other electrical connectors 316b on the sub-assembly 306, and said cable 314b can transmit input/output signals and provide ground (alternatively, a single extension cable and a single connector body can be configured in a similar manner). Therefore, the connector 310 is remotely located on the circuit board 302 relative to the sub-assembly 306, which "frees-up" space on the circuit board for electronic components. For example, electronic component 304a is located in a space underneath extension cable 314a (FIG. 4A), and electronic components 304b and 304c can be located on the circuit board 302 and in spaces underneath the sub-assembly 306 (see specifically FIG. 4B, which omits connector 312a and cable 314a). In other words, the sub-assembly 306 and the circuit board 302 are configured in this way to maximize available space on their respective substrates, thereby allowing for an overall smaller package or device as compared to existing systems that do not have such features. The advantages of this configuration are furthered by the fact that the connector 310 (or its separate bodies 312a and 312b) can have power passives 320a and 320b therein, similar as described with reference to the examples of FIGS. 1A-3, which also frees-up space for computational devices 318 on the sub-assembly 306.

Figure 5:
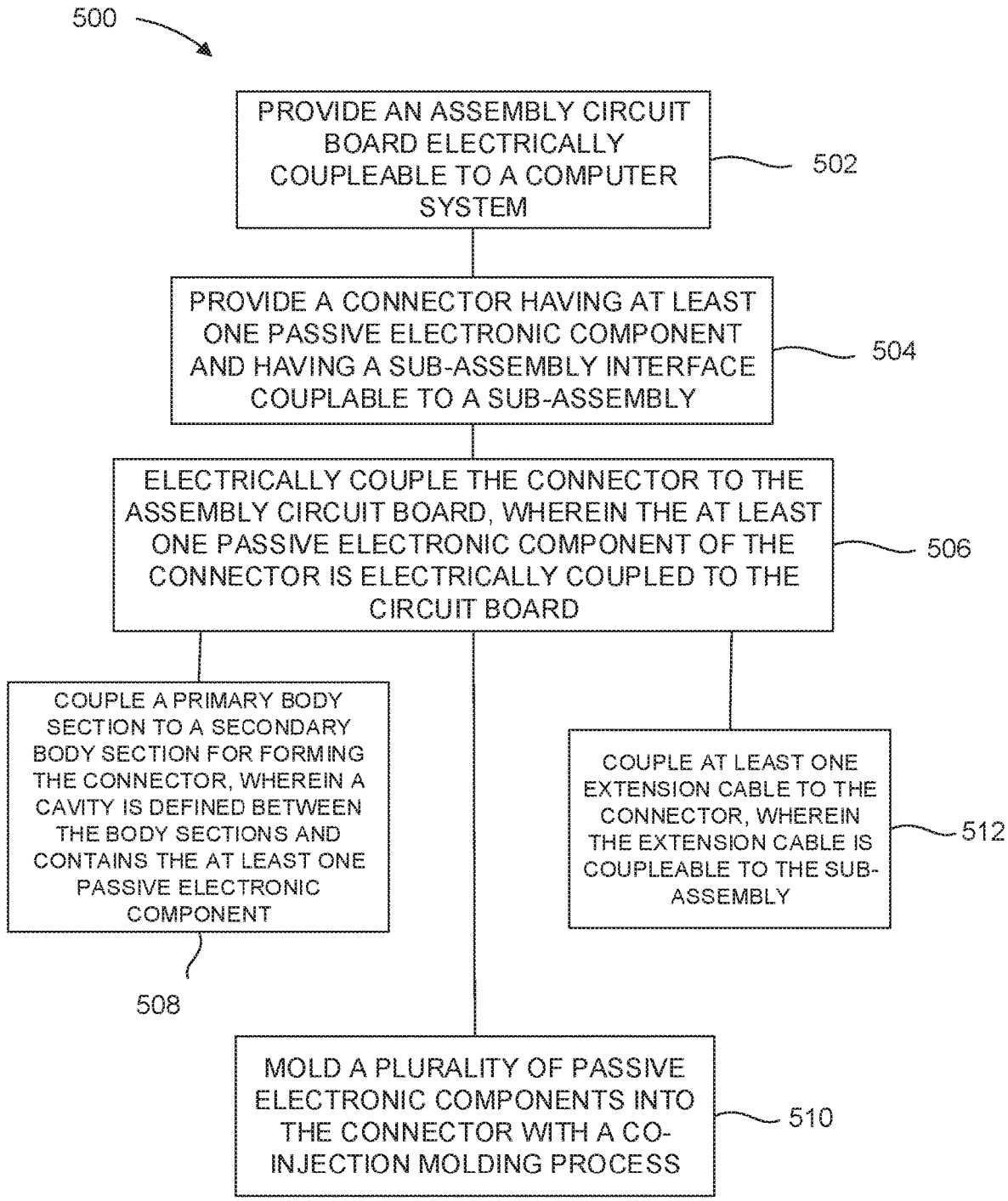
FIG. 5 illustrates a method in accordance with one example.

FIG. 5 illustrates a method 500 of making an electronics assembly capable of receiving an electronics sub-assembly, such as described with reference to FIGS. 1A-4B. The method can comprise step 502 of providing an assembly circuit board electrically coupleable to a computer system; and step 504 of providing a connector having at least one passive electronic component and having a sub-assembly interface coupleable to a sub-assembly; and step 506 of electrically coupling the connector to the assembly circuit board, wherein the at least one passive electronic component of the connector is electrically coupled to the circuit board. In one example, the method comprises step 508 comprising coupling a primary body section to a secondary body section for forming the connector, wherein a cavity is defined between the body sections and contains the at least one passive electronic component. In another example, step 510 comprises molding a plurality of passive electronic components into the connector with a co-injection molding process. In another example, step 512 comprises coupling at least one extension cable to the connector, wherein the extension cable is coupleable to the sub-assembly. Steps 508 and 512 can be combinable in any order, and steps 508 and 510 can be combinable in any order.

Figure 6:
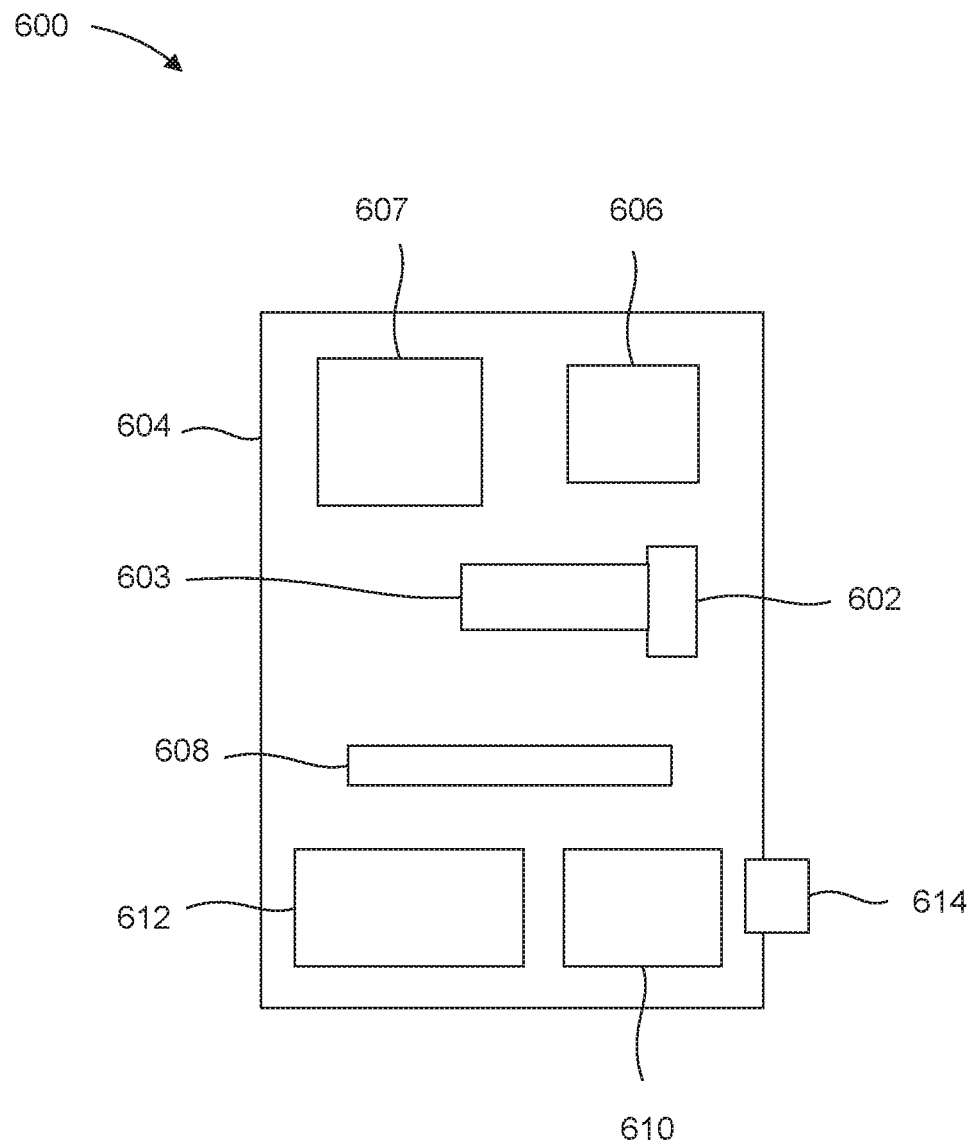
FIG. 6 is a schematic illustration of an exemplary computing system.

FIG. 6 schematically illustrates an example computing system 600. The computing system 600 can include a connector 602 as disclosed herein, coupled to a motherboard 604. In one aspect, the computing system 600 can include a sub-assembly 603 operatively coupled to the connector 602, as disclosed herein. In one aspect, the computing system 600 can also include a processor 606, an electronic device package 607, a memory device 608, a radio 610, a cooling system (e.g., a heat sink and/or a heat spreader) 612, a port 614, a slot, or any other suitable device or component, which can be operably coupled to the motherboard 604. The computing system 600 can comprise any type of computing system, such as a desktop computer, a laptop computer, a tablet computer, a smartphone, a server, a wearable electronic device, etc. Other embodiments need not include all of the features specified in FIG. 6, and may include alternative features not specified in FIG. 6.

EXAMPLES

The following examples pertain to further embodiments.

In one example there is provided a connector coupling an electronics sub-assembly to an electronics assembly. The connector comprises a body having: a sub-assembly interface configured to electronically couple to an electronics sub-assembly; a circuit board interface configured to electronically couple to a circuit board of an electronics assembly; and at least one passive electronic component.

In one example of the connector, the at least one passive electronic component comprises at least one of a resistor, an inductor, or a capacitor.

In one example of the connector, the connector body comprises a primary body section and a secondary body section coupled to the primary body section, wherein a cavity is defined between the body sections and contains the at least one passive electronic component.

In one example of the connector, the connector body further comprises a plurality of passive electronic components.

In one example of the connector, the plurality of passive electronic components are molded into the connector body.

In one example of the connector, at least some of the passive electronic components are electrically coupled to each other by flexible wires.

In one example of the connector, the sub-assembly interface is configured to electronically couple to a solid-state drive device.

In one example of the connector, the solid-state drive device comprises at least one of an M.2 module, an EMMc module, and a 2.5 inch small form factor module.

In one example of the connector, the sub-assembly interface is coupleable to at least one of an M.2 module, an EMMc module, and a 2.5 inch small form factor module.

In one example of the connector, the sub-assembly interface includes a female portion having a plurality of electrical connectors, wherein at least one of the plurality of electrical connectors is electrically coupled to the at least one passive electrical component.

In one example of the connector, the sub-assembly interface is configured to electronically attach to a small form factor board having at least one memory array.

In one example of the connector, the circuit board interface includes a plurality of electrical wires configured to couple to electrical connectors on the electronics assembly.

In one example of the connector, the connector further comprises a plurality of power passives, and a plurality of electrical wires coupled between the circuit board interface and the sub-assembly interface, wherein at least some of the electrical wires are electrically coupled to some of the power passives.

In one example of the connector, the sub-assembly interface is configured to electronically couple to an electronics sub-assembly via at least one extension cable extending between the connector and the electronics sub-assembly.

In one example of the connector, the connector body comprises a power body section and a signal body section adjacent to the power body section, wherein the power body section is configured to electronically couple to a power extension cable extending between the power body section and the electronics sub-assembly, and wherein the signal body section is configured to electronically couple to a signal extension cable extending between the signal body section and the electronics sub-assembly.

In one example there is provided an electronics sub-assembly comprising: a sub-assembly circuit board, and a connector as recited herein.

In one example, the sub-assembly further comprises at least one memory array coupled to the sub-assembly circuit board, wherein the sub-assembly circuit board lacks at least one passive electronic component necessary to operate the electronics sub-assembly.

In one example, the sub-assembly comprises a solid-state drive device comprises at least one of an M.2 module, an EMMc module, and a 2.5 inch small form factor module.

In one example, the sub-assembly is a small form factor device.

In one example, the sub-assembly comprises a cable interface electronically coupled to the connector by at least on extension cable extending between the connector and the sub-assembly.

In one example, the connector body comprises a power body section and a signal body section adjacent to the power body section, wherein the power body section is electronically coupled to a power extension cable extending between the power body section and the sub-assembly, and wherein the signal body section is electronically coupled to a signal extension cable extending between the signal body section and the electronics sub-assembly.

In one example there is provided an electronics assembly comprising: an assembly circuit board electrically coupleable to a computer system; and a connector as recited herein electrically coupled to the assembly circuit board.

In one example, the electronics assembly further comprises a sub-assembly circuit board electrically coupled to the connector.

In one example of the electronics assembly, the sub-assembly comprises at least one memory array, wherein the sub-assembly circuit board lacks at least one passive electronic component necessary to operate the electronics sub-assembly.

In one example of the electronics assembly, the assembly circuit board lacks at least one passive electronic component necessary to operate the electronics sub-assembly.

In one example of the electronics assembly, the sub-assembly is a small form factor device.

In one example of the electronics assembly, the assembly further comprises at least on extension cable extending between and electrically coupling the connector and the sub-assembly, and wherein the sub-assembly is spatially separated above the assembly such that at least one or more electronic components can be attached to the assembly between the assembly and the sub-assembly.

In one example of the electronics assembly, the connector body comprises a power body section and a signal body section adjacent to the power body section, wherein the power body section is electronically coupled to a power extension cable extending between the power body section and the sub-assembly, and wherein the signal body section is electronically coupled to a signal extension cable extending between the signal body section and the electronics sub-assembly.

In one example there is provided a method of making a connector for coupling an electronics assembly to an electronics sub-assembly. The method comprises forming a connector body having: a circuit board interface electronically attachable to an electronics assembly; a sub-assembly interface electronically attachable to an electronics sub-assembly; and at least one passive electronic device.

In one example of the method of making the connector, the at least one passive electronic component comprises at least one of a resistor, an inductor, or a capacitor.

In one example of the method of making the connector, the method further comprises coupling a primary body section to a secondary body section for form the connector body, wherein a cavity is defined between the body sections and contains the at least one passive electronic component.

In one example of the method of making the connector, the connector body further comprises a plurality of passive electronic components.

In one example of the method of making the connector, the method further comprises molding a plurality of passive electronic components into the connector body with a co-injection molding process.

In one example of the method of making the connector, the method further comprises electrically coupling at least some of the passive electronic components to each other with flexible wires before the co-injection molding process.

In one example of the method of making the connector, the sub-assembly interface is configured to electronically couple to a solid-state drive device.

In one example of the method of making the connector, the solid-state drive device comprises at least one of an M.2 module, an EMMc module, and a 2.5 inch small form factor module.

In one example of the method of making the connector, the sub-assembly interface is coupleable to at least one of an M.2 module, an EMMc module, and a 2.5 inch small form factor module.

In one example of the method of making the connector, the sub-assembly interface includes a female portion having a plurality of electrical connectors, wherein at least one of the plurality of electrical connectors is electrically coupled to the at least one passive electrical device.

In one example of the method of making the connector, the sub-assembly interface is configured to electronically attach to a small form factor board having at least one memory array.

In one example of the method of making the connector, the circuit board interface includes a plurality of electrical wires configured to couple to electrical connectors on the electronics assembly.

In one example of the method of making the connector, the method further comprises a plurality of passive electrical devices, and further comprises a plurality of electrical wires coupled between the circuit board interface and the sub-assembly interface, wherein at least some of the electrical wires are electrically coupled to some of the passive electrical devices.

In one example there is provided a method of making an electronics assembly having a connector as recited with the method steps herein.

In one example of the method of making the electronics assembly, the method further comprises soldering-down the connector to a circuit board of the electronics assembly, wherein at least some electrical wires on the circuit board are electrically coupled to at least some passive electrical devices.

In one example of the method of making the electronics assembly, the method further comprises coupling at least one extension cable between the connector and the sub-assembly, and mounting the sub-assembly to a circuit board of the electronics assembly such that the sub-assembly is spatially separated above the circuit board such that at least one or more electronic components can be attached to the circuit board between the circuit board and the sub-assembly.

In one example of the method of making the electronics assembly, the connector body comprises a power body section and a signal body section adjacent to the power body section, and further comprising electronically coupling a power extension cable between the power body section and the sub-assembly, and further comprising electronically coupling a signal extension cable between the signal body section and the electronics sub-assembly.

In one example there is provided an electronics sub-assembly comprising: a sub-assembly circuit board having a sub-assembly interface configured to electrically couple to a connector; and at least one memory array coupled to the sub-assembly circuit board, wherein the sub-assembly circuit board lacks at least one passive electronic components necessary to operate the electronics sub-assembly.

In one example, the sub-assembly is a small form factor device.

In one example, the sub-assembly comprises a solid-state drive device.

In one example of the sub-assembly, the solid-state drive device comprises at least one of an M.2 module, an EMMc module, and a 2.5 inch small form factor module.

In one example of the sub-assembly, the sub-assembly interface includes a male portion having a plurality of electrical connectors, wherein at least one of the plurality of electrical connectors is electrically coupleable to at least one passive electrical device in the connector necessary to operate the sub-assembly.

In one example of the sub-assembly, the sub-assembly circuit board is devoid of passive electrical devices, wherein the passive electrical devices comprise capacitors, resistors, and inductors.

In one example of the sub-assembly, the sub-assembly interface is configured to electronically couple to the connector by at least one extension cable.

In one example of the sub-assembly, the sub-assembly is configured to attach to a circuit board such that the sub-assembly is spatially separated above the circuit board.

In one example there is provided a method of making an electronics assembly capable of receiving an electronics sub-assembly. The method comprises: providing an assembly circuit board electrically coupleable to a computer system; providing a connector having at least one passive electronic component and having a sub-assembly interface coupleable to a sub-assembly; and electrically coupling the connector to the assembly circuit board, wherein the at least one passive electronic component of the connector is electrically coupled to the circuit board.

In one example of the method of making the electronics assembly, the at least one passive electronic component comprises at least one of a resistor, an inductor, or a capacitor.

In one example of the method of making the electronics assembly, the method further comprises coupling a primary body section to a secondary body section for forming the connector, wherein a cavity is defined between the body sections and contains the at least one passive electronic component.

In one example of the method of making the electronics assembly, the connector has a plurality of passive electronic components.

In one example of the method of making the electronics assembly, the method further comprises molding a plurality of passive electronic components into the connector with a co-injection molding process.

In one example of the method of making the electronics assembly, the method further comprises electrically coupling at least some of the passive electronic components to each other with flexible wires before the co-injection molding process.

In one example of the method of making the electronics assembly, the sub-assembly interface is configured to electronically couple to a solid-state drive device.

In one example of the method of making the electronics assembly, the solid-state drive device comprises at least one of an M.2 module, an EMMc module, and a 2.5 inch small form factor module.

In one example of the method of making the electronics assembly, the sub-assembly interface includes a female portion having a plurality of electrical connectors, wherein at least one of the plurality of electrical connectors is electrically coupled to the at least one passive electrical device.

In one example of the method of making the electronics assembly, the sub-assembly interface is configured to electronically attach to a small form factor board having at least one memory array.

In one example of the method of making the electronics assembly, the connector has a circuit board interface having a plurality of electrical wires configured to couple to electrical connectors on the assembly circuit board.

In one example of the method of making the electronics assembly, the connector has a plurality of passive electrical devices electrically coupled between the assembly circuit board and the sub-assembly interface.

In one example of the method of making the electronics assembly, the method further comprises soldering-down the connector to the assembly circuit board, wherein at least some electrical wires on the circuit board are electrically coupled to at least some passive electrical devices.

In one example of the method of making the electronics assembly, the method further comprises coupling at least one extension cable to the connector, wherein the extension cable is coupleable to the sub-assembly.

In one example of the method of making the electronics assembly, the connector body comprises a power body section and a signal body section adjacent to the power body section, and further comprising electronically coupling a power extension cable to the power body section, and further comprising electronically coupling a signal extension cable to the signal body section, wherein the power and signal extension cables are electronically coupleable to the sub-assembly.

In one example there is provided a method of maximizing available space on a circuit board of an electronics sub-assembly. The method comprises providing an electronics sub-assembly having a sub-assembly circuit board with at least one computational device, wherein the sub-assembly circuit board lacks at least one passive electronic component necessary to operate the electronics sub-assembly. The method comprises coupling the electronics sub-assembly to a connector, the connector having at least one passive electronic component that is utilized by the sub-assembly circuit board, thereby maximizing available space on the sub-assembly circuit board.

In one example of the method of maximizing available space, the at least one passive electronic component comprises at least one of a resistor, an inductor, or a capacitor.

In one example of the method of maximizing available space, the connector has a plurality of passive electronic components.

In one example of the method of maximizing available space, the method further comprises electrically coupling the sub-assembly circuit board to the at least one passive electronic component.

In one example of the method of maximizing available space, the sub-assembly is a solid-state drive device.

In one example of the method of maximizing available space, the solid-state drive device comprises at least one of an M.2 module, an EMMc module, and a 2.5 inch small form factor module.

In one example of the method of maximizing available space, the sub-assembly is a small form factor board having at least one memory array.

In one example of the method of maximizing available space, the connector has a circuit board interface having a plurality of electrical wires configured to couple to electrical connectors on an assembly circuit board.

In one example of the method of maximizing available space, the connector has a plurality of passive electrical devices electrically coupled between the assembly circuit board and the sub-assembly circuit board.

In one example there is provided a method of minimizing heat to optimize operating speed of an electronics sub-assembly. The method comprises providing an electronics sub-assembly having a circuit board with at least one computational device, the circuit board lacking at least one passive electronic component necessary to operate the electronics sub-assembly. The method comprises coupling the electronics sub-assembly to a connector of an electronics assembly, the connector having at least some of the passive electronic components necessary to operate the electronics subassembly, thereby minimizing heat induced on the circuit board, and thereby optimizing operating speed of the at least one computational device on the circuit board.

In one example, there is provided a computing system comprising a motherboard, and a connector operably coupled to the motherboard and coupling an electronics sub-assembly to the motherboard. The connector comprises a body having: a sub-assembly interface configured to electronically couple to the electronics sub-assembly; a circuit board interface configured to electronically couple to the motherboard; and at least one passive electronic component.

In one example of a computing system, the computing system comprises a desktop computer, a laptop, a tablet, a smartphone, a server, a wearable electronic device, or a combination thereof.

In one example of a computing system, the computing system further comprises a processor, a memory device, a heat sink, a radio, a slot, a port, or a combination thereof operably coupled to the motherboard.

While the forgoing examples are illustrative of the specific embodiments in one or more particular applications, it will be apparent to those of ordinary skill in the art that numerous modifications in form, usage and details of implementation can be made without departing from the principles and concepts articulated herein.

The invention claimed is:

1. A connector for coupling an electronics sub-assembly to an electronics assembly, the connector comprising:
    a connector body having:
        a sub-assembly interface configured to electronically couple to an electronics sub-assembly;
        a circuit board interface configured to electronically couple to a circuit board of an electronics assembly; and
        at least one passive electronic component; and
    a dielectric support member in contact with the connector body at a location vertically beneath the sub-assembly interface of the connector body, the dielectric support member to position the electronic sub-assembly away from the circuit board, wherein the dielectric support member is vertically between the connector body and the circuit board.

2. The connector of claim 1, wherein the at least one passive electronic component comprises at least one of a resistor, an inductor, or a capacitor.

3. The connector of claim 1, wherein the connector body comprises a primary body section and a secondary body section coupled to the primary body section, wherein a cavity is defined between the body sections and contains the at least one passive electronic component.

4. The connector of claim 1, wherein the connector body further comprises a plurality of passive electronic components.

5. The connector of claim 4, wherein the plurality of passive electronic components are molded into the connector body.

6. The connector of claim 5, wherein at least some of the passive electronic components are electrically coupled to each other by flexible wires.

7. The connector of claim 1, wherein the sub-assembly interface is configured to electronically couple to a solid-state drive device.

8. The connector of claim 7, wherein the solid-state drive device comprises at least one of an M.2 module, an EMMc module, and a 2.5 inch small form factor module.

9. The connector of claim 1, wherein the sub-assembly interface is coupleable to at least one of an M.2 module, an EMMc module, and a 2.5 inch small form factor module.

10. The connector of claim 1, wherein the sub-assembly interface includes a female portion having a plurality of electrical connectors, wherein at least one of the plurality of electrical connectors is electrically coupled to the at least one passive electrical component.

11. The connector of claim 1, wherein the sub-assembly interface is configured to electronically attach to a small form factor board having at least one memory array.

12. The connector of claim 1, wherein the circuit board interface includes a plurality of electrical wires configured to couple to electrical connectors on the electronics assembly.

13. The connector of claim 1, further comprising a plurality of power passives, and further comprising a plurality of electrical wires coupled between the circuit board interface and the sub-assembly interface, wherein at least some of the electrical wires are electrically coupled to some of the power passives.

14. The connector of claim 1, wherein the sub-assembly interface is configured to electronically couple to an electronics sub-assembly via at least one extension cable extending between the connector and the electronics sub-assembly.

15. The connector of claim 1, wherein the connector body comprises a power body section and a signal body section adjacent to the power body section, wherein the power body section is configured to electronically couple to a power extension cable extending between the power body section and the electronics sub-assembly, and wherein the signal body section is configured to electronically couple to a signal extension cable extending between the signal body section and the electronics sub-assembly.

16. An electronics sub-assembly comprising:
a sub-assembly circuit board; and
a connector as recited in claim 1 electrically coupled to the sub-assembly circuit board.

17. The sub-assembly of claim 16, further comprising at least one memory array coupled to the sub-assembly circuit board, wherein the sub-assembly circuit board lacks at least one passive electronic component necessary to operate the electronics sub-assembly.

18. The sub-assembly of claim 16, wherein the sub-assembly comprises a solid-state drive device comprises at least one of an M.2 module, an EMMc module, and a 2.5 inch small form factor module.

19. The sub-assembly of claim 16, wherein the sub-assembly is a small form factor device.

20. The sub-assembly of claim 16, wherein the sub-assembly comprises a cable interface electronically coupled to the connector by at least one extension cable extending between the connector and the sub-assembly.

21. The sub-assembly of claim 16, wherein the connector body comprises a power body section and a signal body section adjacent to the power body section, wherein the power body section is electronically coupled to a power extension cable extending between the power body section and the sub-assembly, and wherein the signal body section is electronically coupled to a signal extension cable extending between the signal body section and the electronics sub-assembly.

22. An electronics assembly comprising: an assembly circuit board electrically coupleable to a computer system; and a connector as recited in claim 1 electrically coupled to the assembly circuit board.

23. The assembly of claim 22, further comprising a sub-assembly circuit board electrically coupled to the connector.

24. The assembly of claim 23, wherein the sub-assembly comprises at least one memory array, wherein the sub-assembly circuit board lacks at least one passive electronic component necessary to operate the electronics sub-assembly.

25. The assembly of claim 23, wherein the assembly circuit board lacks at least one passive electronic component necessary to operate the electronics sub-assembly.

26. The assembly of claim 23, wherein the sub-assembly is a small form factor device.

27. The assembly of claim 22, further comprising at least on extension cable extending between and electrically coupling the connector and the sub-assembly, and wherein the sub-assembly is spatially separated above the assembly such that at least one or more electronic components can be attached to the assembly between the assembly and the sub-assembly.

28. The assembly of claim 22, wherein the connector body comprises a power body section and a signal body section adjacent to the power body section, wherein the power body section is electronically coupled to a power extension cable extending between the power body section and the sub-assembly, and wherein the signal body section is electronically coupled to a signal extension cable extending between the signal body section and the electronics sub-assembly.

* * * * *